(12) United States Patent
Ahmed et al.

(10) Patent No.: US 9,136,691 B2
(45) Date of Patent: Sep. 15, 2015

(54) SOLID STATE RELAY PROTECTIVE DEVICE

(71) Applicant: TYCO ELECTRONICS CORPORATION, Berwyn, PA (US)

(72) Inventors: Mohammad S. Ahmed, Mechanicsburg, PA (US); David Bruce Sarraf, Elizabethtown, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 0 days.

(21) Appl. No.: 13/962,475

(22) Filed: Aug. 8, 2013

(65) Prior Publication Data
US 2015/0043115 A1 Feb. 12, 2015

(51) Int. Cl.
H02H 3/00 (2006.01)
H02H 3/02 (2006.01)
H02H 3/06 (2006.01)
H02H 3/08 (2006.01)
H02H 5/04 (2006.01)
H03K 17/082 (2006.01)
H03K 17/785 (2006.01)
H03K 17/08 (2006.01)

(52) U.S. Cl.
CPC . *H02H 3/02* (2013.01); *H02H 3/06* (2013.01); *H02H 3/08* (2013.01); *H02H 5/04* (2013.01); *H03K 17/0822* (2013.01); *H03K 17/785* (2013.01); *H03K 2017/0806* (2013.01)

(58) Field of Classification Search
CPC ...... H03K 17/0824; H02H 3/08; H02H 3/093

USPC ............. 361/93.7–93.9, 103, 86–87
See application file for complete search history.

(56) References Cited

U.S. PATENT DOCUMENTS

| | | | |
|---|---|---|---|
| 6,594,129 B1 | 7/2003 | Baba et al. | |
| 6,816,758 B2* | 11/2004 | Maxwell et al. | 700/292 |
| 2003/0183838 A1* | 10/2003 | Huang et al. | 257/107 |
| 2009/0167272 A1 | 7/2009 | Furuichi et al. | |
| 2011/0026185 A1* | 2/2011 | Boudet et al. | 361/211 |
| 2011/0292556 A1* | 12/2011 | Britz | 361/91.5 |

FOREIGN PATENT DOCUMENTS

EP 0 068 405 A2 1/1983
GB 2 299 902 A 10/1996

OTHER PUBLICATIONS

International Search Report, International Application No., PCT/US2014/049054, International Filing Date, Jul. 31, 2014.

* cited by examiner

*Primary Examiner* — Danny Nguyen

(57) ABSTRACT

An electrical circuit for protection of a solid-state relay includes a switch element connected between an input signal source and an input terminal of the solid-state relay. The solid-state relay includes an output terminal for connection to a load. A sensing element is associated with the solid-state relay to sense an operating parameter associated with the solid-state relay. A feedback element controls the switch element to switch an operating state in response to the operating parameter exceeding a reference parameter. The solid-state relay changes state in response to the switch element to control an output current of the solid-state relay between an energized or de-energized state.

17 Claims, 3 Drawing Sheets

SOLID STATE RELAY PROTECTIVE DEVICE

BACKGROUND

The application generally relates to a solid state relay protective device. The application relates more specifically to a solid state relay with a feedback circuit for interrupting an input control signal.

In contrast to mechanical relays that use movable contacts to open or close a circuit, a solid state relay (SSR) is a semiconductor switching device such as a silicon controlled rectifier (SCR), a metal-oxide semiconductor field effect transistor (MOSFET) or similar transistor device. A solid-state relay controls the flow of current. A low-level driving signal can control a larger flow of current through the solid-state relay, similar to the way that a mechanical relay may use a low power signal to switch a large current. In contrast with mechanical relays, solid-state relays provide faster switching times, no contact bounce or acoustic noise, the ability to synchronize the switching action with an external event such as the zero crossing of an AC waveform, and no wear mechanisms such as arcing or pitting of contacts.

A solid-state relay may fail, in response to current surges that result, for example, from switching an inductive load, fault current caused by a short circuit, or excess temperature. Excess current causes the solid-state relay to overheat, which may destroy the semiconducting junction that produces the switching action. The switching element of a solid-state relay has a much lower thermal inertia than a mechanical relay, and the safe operating temperature of the solid-state relay switching element is much lower than that of a mechanical relay. These characteristics make the solid-state relay much more sensitive than a conventional mechanical relay to transient overloads such as inrush current due to a motor startup.

Further, solid-state relays often fail in the closed mode, which can leave a circuit energized with no means of removing the load current.

It would be desirable to provide a protective circuit for a solid-state relay with the ability to remove a load current in the event that the solid-state relay fails. Other features and advantages will be apparent from the following disclosure.

SUMMARY

In one embodiment an electrical circuit for protection of a solid-state relay includes a switch element connected between an input signal source and an input terminal of the solid-state relay. The solid-state relay includes an output terminal for connection to a load. A sensing element is associated with the solid-state relay to sense an operating parameter associated with the solid-state relay. A feedback element controls the switch element to switch an operating state in response to the operating parameter exceeding a reference parameter. The solid-state relay changes state in response to the switch element to control an output current of the solid-state relay between an energized or de-energized state.

Another embodiment relates to an electrical circuit for protection of a solid-state relay. The circuit includes a switch element connected between an input signal source and an input terminal of the solid-state relay. The solid-state relay includes an output terminal for connection to a load. A sensing element is associated with the solid-state relay to sense an operating parameter associated with the solid-state relay. A comparator compares the operating parameter with a reference value and control the switch element to switch an operating state of the solid-state relay in response to the operating parameter exceeding a reference parameter.

In still another embodiment a method for protecting a solid state relay includes: connecting a switch element between an input signal source and an input terminal of the solid-state relay; connecting a load to an output terminal of the solid-state relay; sensing an operating parameter associated with the solid-state relay; controlling the switch element via a feedback element; switching an operating state of the switch element in response to the operating parameter exceeding a reference parameter; changing an operating state of the solid-state relay in response to the switch element; and controlling an output current of the solid-state relay between an energized or de-energized state.

Certain advantages of the embodiments described herein are that the solid-state relay feedback circuit may be configured to modulate a relay driving signal based on measurement of a circuit parameter, e.g., current or temperature. As the measured parameter approaches a value that could damage the relay, a feedback signal would remove the drive or input signal, thereby interrupting current flow through the solid-state relay.

Other advantages of the disclosed feedback circuit include that the feedback circuit will only apply an actuating signal to the solid-state relay when an external drive signal is applied.

Alternative exemplary embodiments relate to other features and combinations of features as may be generally recited in the claims.

DETAILED DESCRIPTION OF THE EXEMPLARY EMBODIMENTS

Various embodiments of the solid-state relay feedback circuitry may include discrete analog or digital communications circuitry, or a small microprocessor having at least two inputs and one output. In one embodiment, a first microprocessor input monitors the drive signal, the second input may monitor a current or voltage, and a microprocessor output applies a drive signal to the solid-state relay. In another embodiment, one or more output terminals may be added to be interrogated by the end user to determine the state of the solid-state relay as open, closed, or in a current/temperature limit mode.

Figure 1:
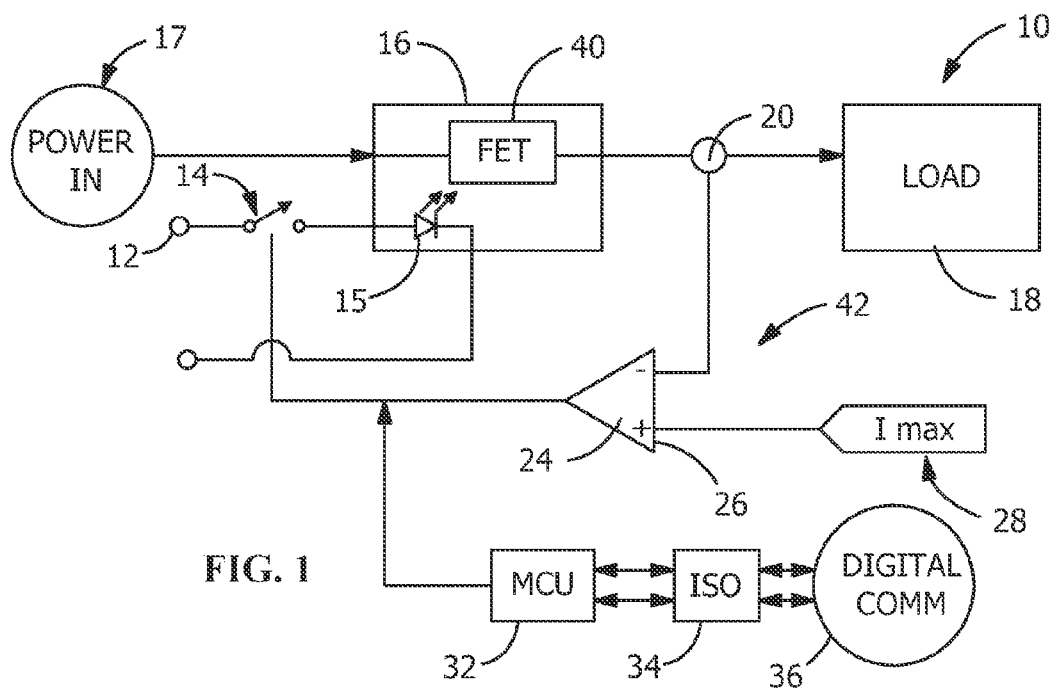
FIG. 1 shows one embodiment of a solid-state relay feedback control circuit.

Referring to FIG. 1, a current-controlled implementation of a solid-state relay feedback control circuit 10 is shown. A control signal 12 passes through an electronic cutout switch 14 and is applied to a solid-state relay (SSR) 16. Cutout switch 14 may be, e.g., a transistor, FET, MOSFET or other suitable electrical switching device. Control signal 12 switches solid-state relay 16 to a conductive state and solid-state relay 16 delivers power to the load 18. In one embodiment, solid-state relay 16 may be an optically coupled SSR. Cutout switch 14 energizes an LED 15 in solid-state relay 16, which actuates a photo-sensitive transistor 40 or other semiconductor device, e.g., an FET or MOSFET—to switch current from an input power source 17 to load 18. The current to load 18 is measured by a current sensor 20. An optically coupled SSR provides electrical isolation of control signals 12 from the power circuit driving load 18, since the only coupling path between input and output is a beam of light or infrared radiation. In an alternate embodiment, solid-state relay 16 may be a transformer coupled device, relay coupled device, or other suitable type of SSR.

A signal from current sensor 20 indicative of the load current is fed to a negative input terminal 22 of a comparator 24. A second signal 28 corresponding to the maximum allowable current ($I_{max}$) through the solid-state relay is fed to a positive input 26 of comparator 24. A digital communications circuit 36 provides the input value $I_{max}$ to a microcontroller unit (MCU) 32 through an isolation device 34. MCU 32 also monitors the output of comparator 24 and communicates the output to the digital communications circuit 36 via isolation device 34. If the value of the signal from current sensor 20 is less than $I_{max}$, comparator 24 will switch to the conductive state and maintain cutout switch 14 in a closed state. Control signal will continue to be applied to solid-state relay 16, and solid-state relay 16 will remain in the closed state delivering current to the load. If the value of the signal from current sensor 20 is greater than (or equal to) $I_{max}$, comparator 24 will switch to the nonconductive state, causing cutout switch 14 to switch to an open, or off, state. With cutout switch 14 in an open state control signal 12 is no longer applied to solid-state relay 16, and current is no longer delivered to load 18. $I_{max}$ may be a static setting on input 26, or may be generated via software, e.g., from a microprocessor-based device.

Circuit 10 will remain in the on-state continuously as long as the load current does not exceed $I_{max}$. The circuit 10 will oscillate between the solid-state relay in the ON state and solid-state relay in the OFF state, as the current rises to a value in excess of $I_{max}$. The oscillation frequency of circuit 10 is based on the response speed of current sensor 20 and the equivalent circuit of load 18. For an inductive load 18 the initial load current is a low value and increases to a maximum load current. While the solid-state relay is OFF for a short interval the rise time may be sufficient to maintain the average power dissipation below the safe value for the solid-state relay. Resistive and capacitive loads may encounter problems in maintaining sufficiently low power dissipation, as the load current may start out at a high value and then decrease, in the case of a capacitive load, or the load current may remain approximately constant at the initial value in the case of a resistive load. Since either of these conditions will result in immediate overload of the relay, extending the OFF interval for capacitive or resistive loads may be necessary to allow the solid-state relay to cool adequately.

Figure 3:
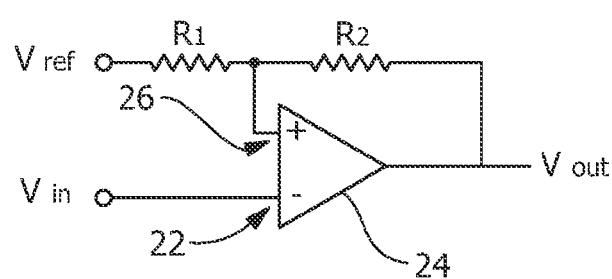
FIG. 3 shows a resistive feedback circuit for use with a comparator in one embodiment.
Figure 4:
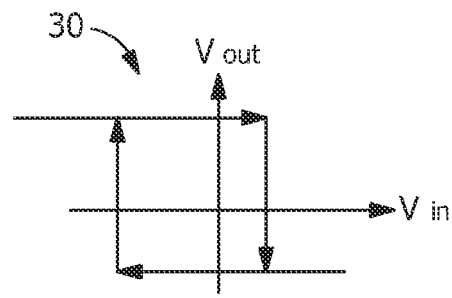
FIG. 4 shows a response curve for an exemplary comparator with hysteresis feedback resistors.

The OFF time interval of circuit 10 may be extended by adding resistive feedback components around the comparator to increase hysteresis (FIG. 4), i.e., the difference between ON and OFF levels. Referring to FIG. 3, a comparator 24 is connected to two feedback resistors R1, R2. Comparator input terminal 26 is connected between R1 and R2, and R2 is connected between comparator input terminal 26 and the output of comparator 24. Comparator input terminal 22, or the negative input terminal is connected to an input voltage source $V_{in}$. R1 is connected on the input or line side to a reference voltage source $V_{ref}$. A response curve 30 for the exemplary comparator with hysteresis feedback resistors is shown in FIG. 4. In an alternate embodiment, a capacitor and diode (not shown) may be added to the feedback network to further increase the OFF time. In still another embodiment additional OFF time delay may be added programmatically for a microprocessor-based system, as a part of an algorithm that observed the rise time and computed the average power dissipation of the solid-state relay.

Figure 2:
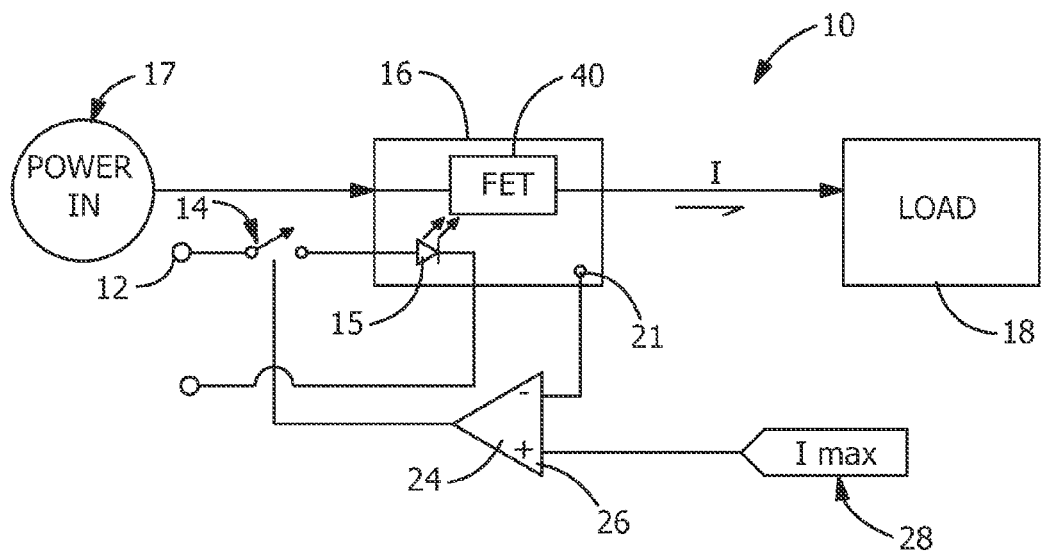
FIG. 2 shows another embodiment of a solid-state relay feedback control circuit.

Referring next to FIG. 2, a temperature-controlled implementation of a solid-state relay feedback control circuit 10 is shown. A control signal 12 passes through electronic cutout switch 14 and is applied to solid-state relay 16. Cutout switch 14 energizes LED 15 in solid-state relay 16, which actuates photo-sensitive transistor 40 to switch current from an input power source 17 to load 18. The temperature of solid-state relay 16 is measured by temperature sensor 21, and the temperature reading transmitted to negative input 22 of comparator 24. A second signal corresponding to the maximum allowable solid-state relay temperature $T_{max}$ is transmitted to positive input 26 of comparator 24. If the value of the signal from temperature sensor 21 is less than the value corresponding to $T_{max}$, comparator 24 turns on and maintains cutout switch 14 closed. Control signal 12 will continue to be applied to the solid-state relay and solid-state relay 16 will remain on and deliver current to the load. If the value of the signal from the temperature sensor is greater than $T_{max}$, comparator 24 will switch states and switch the state of cutout switch 14 to off. Control signal 12 will no longer be applied to solid-state relay 16, and current to load 18 will be turned off.

FET 40 will remain on continuously as long as the current does not exceed the maximum allowable current. The system will oscillate between the solid-state relay ON and solid-state relay OFF state as long as the current rises to a level that exceeds the maximum allowable current. The thermal capacitance and heat sink resistance form a time delay that puts a lower bound on the duration of the OFF time. The thermal capacitance results in a finite cooling time before allowing the comparator to switch back and reapply power to the load.

Removing the drive signal from the solid-state relay would thus prevent the flow of current through the solid-state relay. The lack of current would reduce IR heating in the solid-state relay, and allow the solid-state relay to cool, preventing or mitigating the destructive effect of excess temperature. After a suitable delay, the feedback circuit would allow the driving signal to pass through to the solid-state relay and switch the solid-state relay back to the conductive state. By modulating the drive signal the feedback circuit limits the relay current or temperature to a safe value and therefore provides overcurrent and overtemperature protection to the solid-state relay.

Relay 16 and feedback circuit 42 may operate in the non-linear mode to minimize power dissipation by the active device—e.g., FET 40—in solid-state relay 16. Relay 16 may be either fully on (saturated) or fully off (cut off). Solid-state relay 16 will never be operated in the linear region, i.e., where the solid-state relay is partially conducting and power dissipation is much greater. When the protective circuit, described above with respect to FIGS. 1 and 2, is active, solid-state relay 16 will output a pulsed waveform rather than a continuous current.

When temperature is the feedback parameter for solid-state relay 16, the OFF time may be comparable to the thermal time constant associated with relay 16, to allow enough time for the temperature of solid-state relay 16 to decrease. Temperature control may also be obtained by using hysteresis, wherein the solid-state relay would switch to the non-conductive mode at a high temperature limit and return to a conductive mode at a low temperature limit.

When current sensing is the solid-state relay feedback parameter, the feedback circuit limits the average current to the value that the relay is capable of passing safely. In addition, the pulse width of the ON time could be made comparable to the relay's thermal time constant to avoid spikes of excess temperature.

Figure 5:
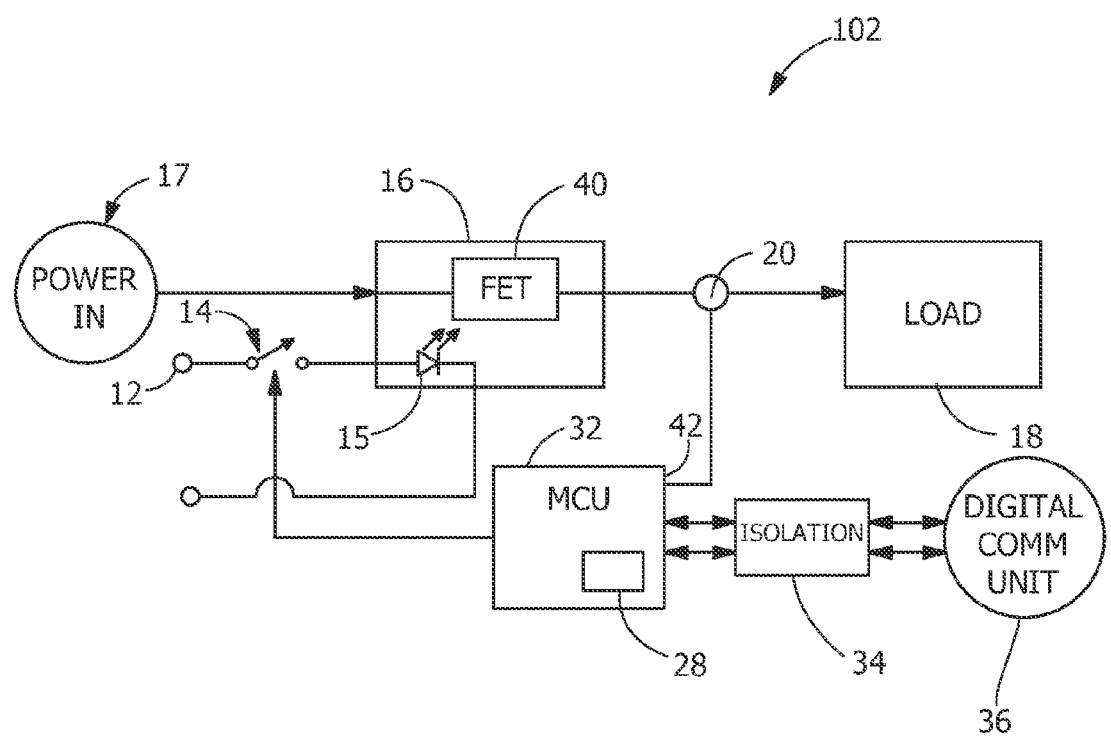
FIG. 5 shows a third embodiment of a solid-state relay feedback control circuit.

Referring next to FIG. 5, an SSR feedback circuit 102 controlled by MCU 32 is shown. Control signal 12 passes through electronic cutout switch 14 and is applied to SSR 16. Control signal 12 switches SSR 16 to a conductive state and solid-state relay 16 delivers power to the load 18. As indicated above with respect to FIGS. 1 and 2, solid-state relay 16 may be an optically coupled SSR, although the invention is not limited to optically coupled SSRs. Cutout switch 14 energizes an LED 15 in solid-state relay 16, which actuates a photosensitive transistor 40 or other semiconductor device, e.g., an FET or MOSFET—to switch current from an input power source 17 to load 18. The current to load 18 is measured by a current sensor 20. SSR 16 may be a transformer coupled device, relay coupled device, or other suitable type of SSR.

A signal from current sensor 20 indicative of the load current is fed to a negative input 42 of MCU 32. The maximum allowable current ($I_{max}$) through the solid-state relay is a pre-programmed parameter in MCU 32, e.g., wherein the value of $I_{max}$ is communicated to MCU 32 through an isolation device 34 from digital communications circuitry 36. If the value of the signal from current sensor 20 is less than $I_{max}$, MCU 32 will continue to apply the control signal to solid-state relay 16, and solid-state relay 16 will remain in the closed state delivering current to the load. If the value of the signal from current sensor 20 is greater than (or equal to) $I_{max}$, MCU 32 will control switch 14 to change to the open, or off, state. With cutout switch 14 in an open state control signal 12 is no longer applied to solid-state relay 16, and current is no longer delivered to load 18. $I_{max}$ may be a static setting on in MCU 32, or may be generated externally and transmitted to MCU 32 as described above.

Circuit 10 will remain in the on-state continuously as long as the load current does not exceed $I_{max}$. The circuit 10 will oscillate between the solid-state relay in the ON state and solid-state relay in the OFF state, as the current rises to a value in excess of $I_{max}$. The oscillation frequency of circuit 10 is based on the response speed of current sensor 20 and the equivalent circuit of load 18. For an inductive load 18 the initial load current is a low value and increases to a maximum load current.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

What is claimed is:

1. An electrical circuit for protection of a solid-state relay comprising:
    a switch element connected between an input signal source and a control input terminal of the solid-state relay;
    the solid-state relay comprising an output terminal for connection to a load;
    a sensing element associated with the solid-state relay to sense an operating parameter associated with the solid-state relay;
    a feedback element configured to control the switch element to switch an operating state in response to the operating parameter exceeding a reference parameter;
    wherein the feedback element is a comparator configured to compare a first value corresponding to a sensed operating parameter of the solid-state relay, and a second value corresponding to a predetermined maximum operating parameter of the solid-state relay; and
    a resistive feedback circuit connected to the feedback element, the resistive feedback circuit comprising:
        a first resistor and a second resistor, the first resistor connected between a reference voltage source and a first input terminal of the feedback element, and the second resistor connected between an output terminal of the feedback element and the first input terminal of the feedback element;
    wherein a time interval between opening the switch element and closing the switch element is extended by the first resistor and the second resistor; and
    wherein the solid-state relay changes state in response to the switch element to control an output of the solid-state relay between an energized or de-energized state.

2. The circuit of claim 1, wherein the sensing element is a current sensor, the current sensor configured to sense the load current associated with the solid-state relay.

3. The circuit of claim 1, wherein the sensing element is a temperature sensor, the temperature sensor configured to sense the operating temperature of the solid-state relay.

4. The circuit of claim 2, wherein the feedback element is configured to control the switch element to switch an operating state of the switch element in response to the load current exceeding a predetermined current value.

5. The circuit of claim 3, wherein the feedback element is configured to control the switch element to switch an operating state of the switch element in response to the operating temperature of the solid-state relay exceeding a predetermined temperature value.

6. The circuit of claim 1, wherein the feedback element is configured to close the switch element in response to the sensed operating parameter being less than the maximum operating parameter, and to maintain the switch element in the closed state while the sensed operating parameter remains less than the maximum operating parameter.

7. The circuit of claim 6, wherein the feedback element is configured to open the switch element in response to the sensed operating parameter being equal or greater than the maximum operating parameter, and to maintain the switch element in the open state while the sensed operating parameter remains equal to or greater than the maximum operating parameter.

8. The circuit of claim 7, wherein the feedback element is configured to return the switch element to the closed state in response to the sensed operating parameter decreasing below the maximum operating parameter, and to maintain the switch element in the closed state while the sensed operating parameter is less than the maximum operating parameter.

9. The circuit of claim 1, further comprising a second input terminal of the comparator connected to a voltage input source.

10. The circuit of claim 1, wherein the feedback element is a microcontroller unit preprogrammed to compare a first value corresponding to a sensed operating parameter of the solid-state relay, and a second value corresponding to a predetermined maximum operating parameter of the solid-state relay.

11. The circuit of claim 1, wherein the solid state relay further comprises an LED responsive to the switch element, the LED optically coupled to a photosensitive transistor device, the photosensitive transistor device configured to switch an operating state of the solid state relay in response to sensing an optical input from the LED.

12. An electrical circuit for protection of a solid-state relay comprising:
    a switch element connected between an input signal source and an input terminal of the solid-state relay;
    the solid-state relay comprising an output terminal for connection to a load;

a sensing element associated with the solid-state relay to sense an operating parameter associated with the solid-state relay;

a feedback element configured to compare the operating parameter with a reference value and control the switch element to switch an operating state of the solid-state relay in response to the operating parameter exceeding a reference parameter;

wherein the feedback element is a comparator configured to compare a first value corresponding to a sensed operating parameter of the solid-state relay, and a second value corresponding to a predetermined maximum operating parameter of the solid-state relay; and a resistive feedback circuit connected to the feedback element, the resistive feedback circuit comprising:

a first resistor and a second resistor, the first resistor connected between a reference voltage source and a first input terminal of the feedback element, and the second resistor connected between an output terminal of the feedback element and the first input terminal of the feedback element;

wherein a time interval between opening the switch element and closing the switch element is extended by the first resistor and the second resistor.

13. The circuit of claim 12, wherein the operating parameter of the solid-state relay is one of the current or the temperature.

14. The circuit of claim 12, wherein the sensing element is a current sensor or a temperature sensor.

15. A method for protecting a solid state relay, comprising:
connecting a switch element between an input signal source and an input terminal of the solid-state relay;
connecting a load to an output terminal of the solid-state relay;
sensing an operating parameter associated with the solid-state relay;
controlling the switch element via a feedback element;
switching an operating state of the switch element in response to the operating parameter exceeding a reference parameter;
changing an operating state of the solid-state relay in response to the switch element; and
controlling an output current of the solid-state relay between an energized or de-energized state;
wherein the solid state relay comprises an LED optically coupled to a phototransistor device; and
the step of controlling the switch element via a feedback element comprises:
switching an operating state of the solid state relay in response to an optical input from the LED via the photosensitive transistor device.

16. The method of claim 15, further comprising wherein sensing an operating parameter comprises sensing a current through the solid state relay.

17. The method of claim 15, wherein sensing an operating parameter comprises sensing an operating temperature of the solid state relay.

* * * * *